(12) United States Patent
Ohmi et al.

(10) Patent No.: US 6,597,039 B2
(45) Date of Patent: Jul. 22, 2003

(54) COMPOSITE MEMBER, ITS SEPARATION METHOD, AND PREPARATION METHOD OF SEMICONDUCTOR SUBSTRATE BY UTILIZATION THEREOF

(75) Inventors: Kazuaki Ohmi, Yokohama (JP); Kiyofumi Sakaguchi, Yokohama (JP); Kazutaka Yanagita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/020,807

(22) Filed: Dec. 18, 2001

(65) Prior Publication Data

US 2002/0093047 A1 Jul. 18, 2002

Related U.S. Application Data

(62) Division of application No. 09/250,242, filed on Feb. 16, 1999, now Pat. No. 6,342,433.

(30) Foreign Application Priority Data

Feb. 18, 1998 (JP) .......................................... 10-035820

(51) Int. Cl.⁷ ........................ H01L 27/01; H01L 27/12; H01L 31/0392
(52) U.S. Cl. ........................................ 257/347; 257/349
(58) Field of Search ................................. 257/347, 349

(56) References Cited

U.S. PATENT DOCUMENTS

| | | | |
|---|---|---|---|
| 4,727,047 A | 2/1988 | Bozler et al. | 437/89 |
| 5,371,037 A | 12/1994 | Yonehara | 437/86 |
| 5,650,353 A | 7/1997 | Yoshizawa et al. | 437/62 |
| 5,811,348 A | 9/1998 | Matsushita et al. | 438/455 |
| 5,854,123 A | 12/1998 | Sato et al. | 438/507 |
| 5,856,229 A | 1/1999 | Sakaguchi et al. | 438/406 |
| 5,897,743 A | 4/1999 | Fujimoto et al. | 156/584 |
| 6,020,252 A | 2/2000 | Aspar et al. | 438/458 |
| 6,054,363 A | 4/2000 | Sakaguchi et al. | 438/406 |
| 6,091,112 A | 7/2000 | Kwon | 438/459 |
| 6,107,213 A | 8/2000 | Tayanaka | 438/762 |
| 6,140,210 A | 10/2000 | Aga et al. | 438/458 |
| 6,143,628 A | 11/2000 | Sato et al. | 438/455 |
| 6,221,738 B1 | 4/2001 | Sakaguchi et al. | 438/455 |
| 6,246,068 B1 | 6/2001 | Sato et al. | 257/3 |
| 6,258,698 B1 | 7/2001 | Iwasaki et al. | 438/455 |
| 6,294,478 B1 * | 9/2001 | Sakaguchi et al. | 148/33.2 |

FOREIGN PATENT DOCUMENTS

| | | |
|---|---|---|
| EP | 0 628 995 | 12/1994 |
| EP | 824267 | 2/1995 |
| EP | 0 767 486 | 4/1997 |
| EP | 0 793 263 | 9/1997 |
| EP | 0 797 258 | 9/1997 |
| JP | 62-8100 | 1/1987 |
| JP | 6-112451 | 4/1994 |
| JP | 7-302889 | 11/1995 |
| JP | 8-213645 | 8/1996 |
| JP | 9-162090 | 6/1997 |
| JP | 9-263500 | 10/1997 |
| JP | 10-79414 | 3/1998 |
| JP | 11-45840 | 2/1999 |
| KR | 97-67955 | 10/1997 |
| WO | 98/33209 | 7/1998 |

OTHER PUBLICATIONS

Patent abstracts of Japan, vol. 096, No. 012, Dec. 26, 1996 (correspondence to JP 8–213645).
Journal of the Water Jet Tech. Soc. of Japan, vol. 1, No. 1, pp. 4–15(1984).

* cited by examiner

Primary Examiner—Amir Zarabian
Assistant Examiner—Kusha Rose
(74) Attorney, Agent, or Firm—Fitzpatrick, Cella, Harper & Scinto

(57) ABSTRACT

A composite member containing a separation area inside. A mechanical strength of the separation area is non-uniform along a surface of the composite member or along a bonded face. A mechanical strength of a peripheral portion of the separation area is locally low.

2 Claims, 10 Drawing Sheets

COMPOSITE MEMBER, ITS SEPARATION METHOD, AND PREPARATION METHOD OF SEMICONDUCTOR SUBSTRATE BY UTILIZATION THEREOF

CROSS-REFERENCE TO RELATED APPLICATION

This application is a division of a application Ser. No. 09/250,242 filed Feb. 16, 1999 now U.S. Pat. No. 6,342,433.

BACKGROUND OF THE INVENTION

1. Field of the Invention

The present invention relates to a composite member, its separation method and a preparation method of a semiconductor substrate, particularly to a composite member having inside a fragile structure with a low mechanical strength, its separation method and a preparation method of a semiconductor substrate. The present invention is particularly suitable for a preparation method of a substrate (SOI substrate) having an SOI (semiconductor on insulator) structure as a type of semiconductor substrate.

2. Related Background Art

A device using the SOI substrate has various advantages which cannot be attained by an ordinary Si substrate. For example, the advantages are as follows:

(1) a dielectric is easily separated, and the device is suitable for high integration;
(2) the device is superior in resistance to rays;
(3) a floating capacity is small, and high speed operation of elements is realized;
(4) a well process is unnecessary;
(5) latch-up can be prevented; and
(6) a complete depletion type field-effect transistor can be formed by thinning films.

Since the SOI structure has various advantages as described above, researches concerning its forming method have been advanced these several decades. Known as a conventional SOI technique is an SOS (silicon on sapphire) technique for forming Si on a single-crystal sapphire substrate by hetero epitaxial growth in CVD (chemical vapor deposition) method. The SOS technique has been evaluated as most matured SOI technique, but has not been put to practical use because of a large amount of crystal defects caused by lattice mismatching in an interface of an SI layer and a base sapphire substrate, mixture of aluminum constituting the sapphire substrate into the Si layer, substrate price, delay in area enlargement, and for other reasons.

Following the SOS technique, an SIMOX (separation by ion implanted oxygen) technique has appeared. Concerning the SIMOX technique, various methods have been developed aiming at reduction of the crystal defects or reduction of manufacture cost. Examples of the methods include a method of injecting oxygen ions to a substrate to form an embedded oxide layer; a method of bonding two wafers via an oxide film, polishing or etching one of the wafers, and leaving a thin single-crystal Si layer on the oxide film; a method of implanting hydrogen ions into a predetermined depth from a surface of an Si substrate with an oxide film formed thereon, bonding with the other substrate, leaving a thin single-crystal Si layer on the oxide film by heating or another treatment, and peeling off the bonded substrate (other substrate); and the like.

A new SOI technique has been disclosed in Japanese Patent No. 2,608,351 or U.S. Pat. No. 5,371,037. In the technique, a first substrate obtained by forming a non-porous single-crystal layer on a single-crystal semiconductor substrate with a porous layer formed thereon is bonded on a second substrate and these substrates are bonded, then unnecessary portions are removed, so that the non-porous single-crystal layer is transferred to the second substrate. The technique is superior in that the SOI layer has a superior film thickness uniformity, a crystal defect density of the SOI layer can be reduced, the SOI layer has a good surface flatness, a manufacture device with expensive and special specifications is unnecessary and that SOI substrates having SOI films in the range of about several 10 nm to 10 $\mu$m can be manufactured with the same manufacture device.

Furthermore, the present applicant has disclosed a technique in Japanese Patent Application Laid-open No. 7-302889, in which after first and second substrates are bonded, the first substrate is separated from the second substrate without being collapsed, a surface of the separated first substrate is then smoothed, and a porous layer is formed thereon again, so that the first substrate is reused. An example of the proposed method will be described with reference to FIGS. 12A to 12C. After a surface layer of a first Si substrate 1001 is made porous to form a porous layer 1002, a single-crystal Si layer 1003 is formed on the layer 1002, and the single-crystal Si layer and a main surface of a second Si substrate 1004 separate from a first Si base substrate are bonded to each other via an insulating layer 1005 (FIG. 12A). Thereafter, a wafer bonded via the porous layer is divided (FIG. 12B), and the porous Si layer exposed to the surface of a second Si base substrate is selectively removed to form an SOI substrate (FIG. 12C). The first Si substrate 1001 can be reused by removing the remaining porous layer therefrom.

In the invention disclosed in Japanese Patent Application Laid-open No. 7-302889, the substrate is separated using the property that the structure of the porous silicon layer is more fragile than a non-porous silicon. Since the substrate once used in preparation of the semiconductor substrate can be used again in preparation of the semiconductor substrate, the cost of the semiconductor substrate can effectively be reduced. Moreover, in the technique, since the first substrate can be used without being wasted, the manufacture cost can largely be reduced. Additionally, the manufacture process is advantageously simple.

Examples of the method for separating the first and second base substrates (base plates) include pressurizing, pulling, shearing, wedge insertion, thermal treatment, oxidization, vibration application, wire cutting, and the like. Additionally, the present inventors have proposed a separation method in Japanese Patent Application No. 9-75498 or U.S. patent application No. 047,327 filed on Mar. 25, 1998, in which fluid is sprayed to a separation area. Gas and/or liquid is used as the fluid, and especially a water jet using a liquid mainly composed of water is preferable. In the method, at the time of separating, water not only cuts a bonded face but also uniformly enters a gap between the first and second bases, so that a relatively uniform separating pressure can be applied to the entire separation face. Moreover, in the method, different from the case where gas is not used, particles can be washed away without being scattered. The method is superior in these two respects to the separation method by the wedge insertion. Especially, when the mechanical strength of the separation area is set lower than that of the bonded place, only the fragile portion is ruptured, collapsed or removed by spraying the fluid flow to the separation area, and another strong portion can advantageously be left without being collapsed.

However, when the water jet or another fluid is used to separate the bonded composite member by spraying the fluid to a side face of a composite member, especially around a side face of the separation area, there is a case where the fluid flow cannot easily break or cut the separation area because the separation area has an excessive strength. In this case, the composite member can be separated by raising a fluid pressure, but if the pressure is excessively raised, cracks advance inward from the side face of the bonded base. In the midst, one or both of the separated base substrates may be cracked by the pressure of the fluid injected to the separation area. Therefore, yield is lowered in the separating process. To avoid this, there is provided a method of further lowering the mechanical strength of the separation area to form a more fragile structure. If the structure is excessively fragile, however, a problem is caused that the separation area is broken and cannot be bonded or that the separation area is broken to generate particles as contaminants during heating, cleaning, or handling the base substrate otherwise in a process of preparing the composite member.

Moreover, when separation is performed in another method without using the fluid, basically the similar problem is caused. Therefore, the yield in the separating process may be lowered.

SUMMARY OF THE INVENTION

An object of the present invention is to provide a composite member and its separation method in which the composite member can be separated relatively easily without damaging separated bases.

Another object of the present invention is to provide a composite member and its separation method in which a mechanical strength of a major separation area can be relatively raised, unintended collapse of the separation area is prevented, and generation of particles is suppressed.

According to an aspect of the present invention, there is provided a preparation method of a semiconductor substrate using a separation method of a composite member comprising the step of separating the composite member into a plurality of members at a separation area, in which a mechanical strength of the separation area is non-uniform along a bonded face.

Especially, in the separation area, a peripheral portion of the composite member is preferably lower in mechanical strength than a central portion. Additionally, the separation area is preferably lower in mechanical strength than the bonded interface.

According to another aspect of the present invention, there is provided a preparation method of a semiconductor substrate using the separation method mentioned above.

According to still another aspect of the present invention, there is provided a preparation method of a semiconductor substrate which comprises separating a composite member formed by bonding a first base substrate and a second base substrate to each other into a plurality of members at a separation area formed in a position different from a bonded face, a mechanical strength of the separation area being non-uniform along the bonded face, and a mechanical strength of a peripheral portion of the separation area being locally low.

According to a further aspect of the present invention, there is provided a composite member comprising a separation area inside, a mechanical strength of the separation area being non-uniform along a surface of the composite member, a mechanical strength of a peripheral portion of the separation area being locally low.

For the separation area, a porous layer formed by anodization, a layer formed by implanting ions in which microcavities can be obtained, or the like can be used. When an Si wafer or another semiconductor substrate, or a quartz wafer is used as a first or second base, it substantially has a disc shape although it has an orientation flat or a notch. Therefore, the composite member obtained by bonding the first and second base substrates to each other also has a substantially disc shape. In this case, when the mechanical strength of the separation area is non-uniform in such a manner that the strength is high in the central portion of the composite member and low in its peripheral portion, and substantially uniform in a circumferential direction, the composite member can effectively be separated. When the composite member is a rectangular plate member, the mechanical strength of its corner, side or entire periphery is lowered.

The mechanical strength can be made non-uniform by forming portions different in porosity from one another in the separation area. As the porosity is increased, the mechanical strength is lowered. Therefore, the mechanical strength can be changed by changing the porosity. Specifically, the mechanical strength of the peripheral portion can be lowered by setting higher the porosity in the peripheral portion than in the central portion.

The mechanical strength can also be made non-uniform by changing a thickness of the separation area. As the thickness of the separation area is increased, the mechanical strength is lowered. Therefore, the mechanical strength is also changed by changing the thickness. Specifically, the mechanical strength of the peripheral portion can be lowered by setting a thickness of a porous layer of the separation area larger in the peripheral portion than in the central portion of the base.

In order to obtain a suitable composite member which fails to be separated in a process prior to a process of separating the composite member and is securely separated in the separation process, the separation area is preferably formed by a plurality of layers different in mechanical strength. Especially, in the separation area comprising the plurality of layers, the thickness of a layer high in porosity is preferably less than the thickness of a layer low in porosity adjacent to a non-porous single-crystal semiconductor layer. A structure of each of the plurality of layers does not necessarily have to be steeply changed in an interface. Even if the strength or structure of each layer is continuously changed in the interface of the adjacent layers, separation is facilitated as compared with when the strength is uniform over the entire separation area.

In the separation area comprising the plurality of layers different in the mechanical strength, the layer high in porosity preferably has a higher porosity in the peripheral portion than in the vicinity of the central portion of the base.

In the separation area comprising the plurality of layers different in the mechanical strength, the porosity of a second layer with a high porosity can be made higher in the peripheral portion than in the central portion of the base substrate by making the thickness of a first layer with a small porosity larger in the peripheral portion than in the central portion of the base.

The present inventors have conducted experiments in which an anodization device is variously modified to form a good-quality porous layer. As a result, they have found that there is an Si wafer having an in-plane porosity distribution among a plurality of Si wafers subjected to a porous treatment using a certain mode of anodization device. Moreover, as a result of experiments in which samples are prepared by forming non-porous layers on porous layers and the nonporous layers are peeled off, it has been found that in some of the samples even the porous layer relatively low in porosity can be peeled off more easily than the layer relatively high in porosity. It is seen from the aforementioned two findings that, as in an embodiment described later, when the layer relatively high in porosity is ruptured or collapsed in the porous layers having the in-plane distribution of porosity, the layer relatively low in porosity is also easily ruptured, which is not much influenced by an absolute value of porosity.

Specifically, it has been found that when there is a layer relatively high in porosity in the peripheral portion of a member in which separation can easily be started, the separation is facilitated regardless of the absolute value of porosity, and the present invention has been developed.

DETAILED DESCRIPTION OF THE PREFERRED EMBODIMENTS

Figure 1A:
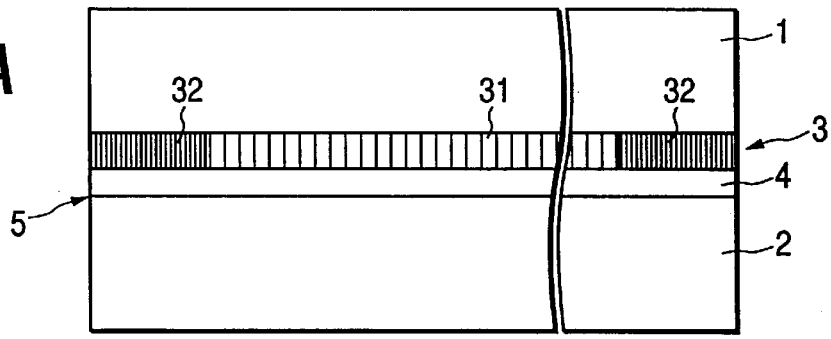
FIGS. 1A, 1B and 1C are schematic sectional views of a composite member according to the present invention.
Figure 1B:
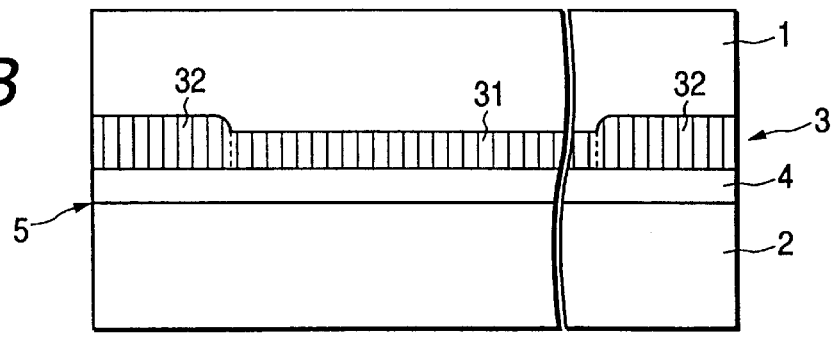
Figure 1C:
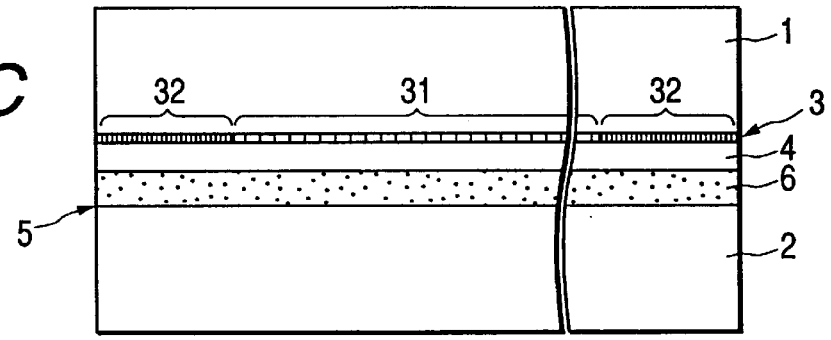

FIGS. 1A to 1C are sectional views of a composite member according to one embodiment of the present invention.

The composite member is formed by bonding a first base substrate 1 and a second base substrate 2 to each other, and a separation area 3 is formed inside. Here, the first base substrate 1 is bonded in such a manner that a layer 4 formed on the separation area 3 abuts on a surface of the second base substrate 2, and a bonded interface 5 is formed. The separation area 3 has a portion 31 relatively high in mechanical strength and a weak portion 32, and the mechanically weak portion 32 is positioned in a peripheral portion of the composite member (peripheral portion of the separation area). In the case of separating the composite member, since the portion 32 relatively low in mechanical strength is positioned in the peripheral portion of the composite member, the portion 32 is first cracked or collapsed, and the separation of the composite member is thus facilitated.

Figure 2A:
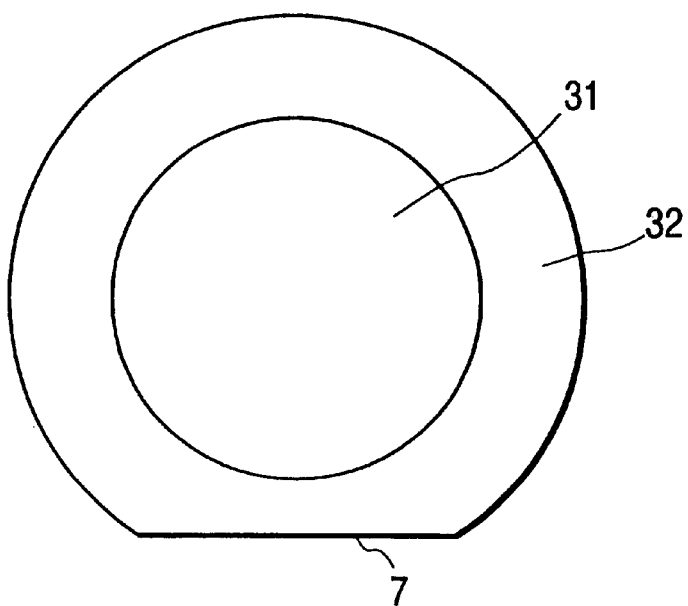
FIGS. 2A and 2B are top views of the composite member according to the present invention.
Figure 2B:
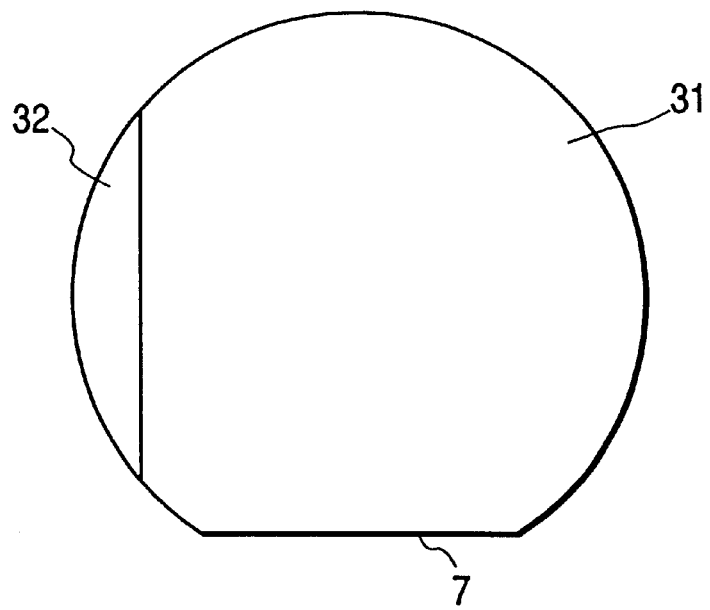

More specifically, FIG. 1A shows that the portion 32 of a porous material high in porosity is formed in the peripheral portion of the separation area 3 uniform in thickness, while the portion 31 of a porous material low in porosity is formed in a central portion, so that the portion 32 locally low in mechanical strength is provided in the peripheral portion. FIG. 2A shows positions of the mechanically strong and weak portions 31, 32 in the composite member as viewed from top. Numeral 7 denotes an orientation flat provided as required. Additionally, as shown in FIG. 2B, the mechanically weak portion 32 may be partially formed in the outer periphery of the composite member, instead of being formed in the entire outer periphery. The mechanically strong portion is larger than the weak portion. FIG. 1B shows the mechanically weak portion 32 formed in the peripheral portion by making non-uniform the thickness of the separation area 3 of a porous material uniform in porosity. Also in this case, as shown in FIG. 2B, the portion 32 may partially be formed in the outer periphery in the plane of the separation area 3. FIG. 1C shows the mechanically weak portion 32 formed by implanting ions to form a portion having a large ion implantation amount in the peripheral portion. Also in this case, as shown in FIG. 2B, the mechanically weak portion 32 may partially be formed in the outer periphery by locally increasing the ion implantation amount. When hydrogen ions or rare gas ions are implanted, and a predetermined thermal treatment is performed, microcavities are generated. Therefore, a portion in which the ions are injected in high concentration may be formed into a porous portion high in porosity. The mechanically weak portion 32 may locally be formed by setting higher the porosity and thickness of the porous material than the other portions. Moreover, the mechanical strength of the ion implantated portion may be lowered by locally implanting the ions into the separation area formed of the porous material and making fragile the porous material. That is, it is preferable to appropriately combine the characteristics of the structures shown in FIGS. 1A to 1C.

Preferably used as the first base substrate 1 of the present invention is an Si wafer or a plate-like semiconductor wafer of Ge, SiGe, SiC, GaAs, GaAlAs, InP, GaN or the like.

In addition to the same semiconductor wafer as that of the first base substrate 1, a quartz glass, resin sheet or another insulating base, and a stainless steel or another metallic base substrate may be used as the second base substrate 2.

The non-porous layer preferably comprises a single layer or a plurality of layers formed of a material selected from the group consisting of the same semiconductor materials as those for use in the first base. When the composite member is separated to prepare SOI substrate, a single-crystal semiconductor layer is preferable.

A layer 6 is preferably formed of an insulating material, a conductive material, or another material different from the material of the layer 4.

Furthermore, the first and second base substrates are preferably bonded via an insulating layer or an adhesive layer.

Figure 3A:
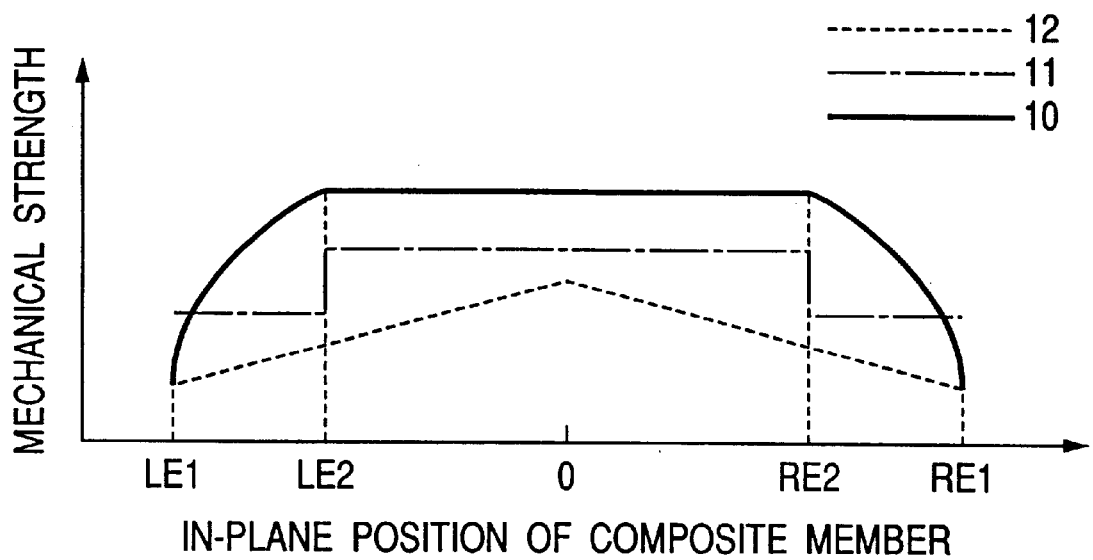
FIGS. 3A and 3B show in-plane distributions of mechanical strength of the composite member according to the present invention.
Figure 3B:
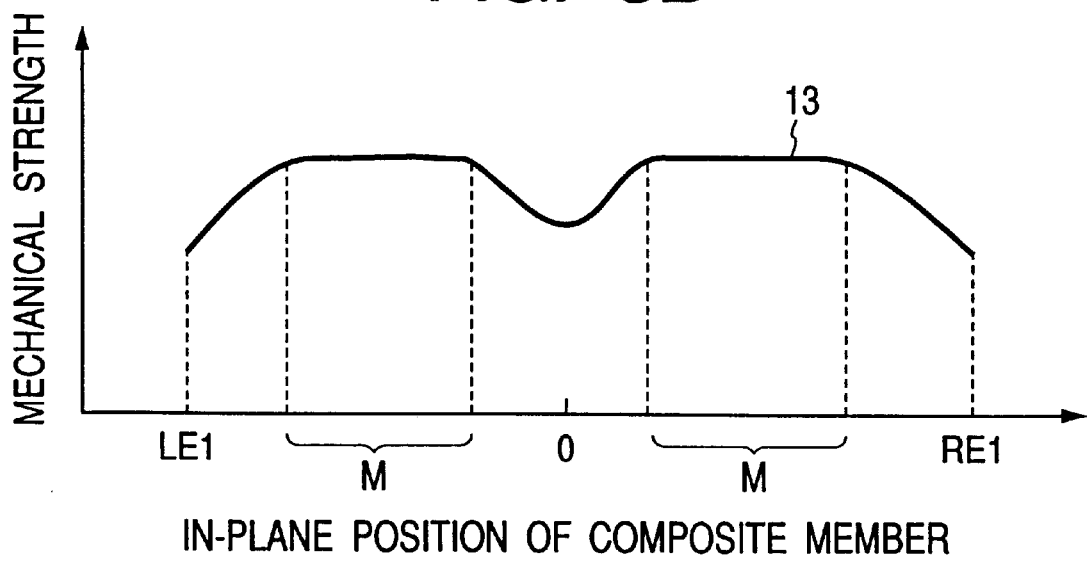

FIGS. 3A and 3B are graphs relatively showing distributions of mechanical strength in the plane of the composite member.

A solid line 10 shows a mode in which the mechanical strength gradually increases from a left edge of an outer periphery LE1 toward a center 0 of the composite member, and a portion between positions LE2 and RE2 including the center 0 has the lowest mechanical strength. A dashed line 11 shows a mode in which the mechanical strength has an intermittent transition between an outer periphery (between outer peripheral edge LE1 and position LE2, between outer peripheral edge RE1 and position RE2) and a central portion (from position LE2 to RE2). A broken line 12 shows a mode in which the mechanical strength continuously increases from the outer peripheral edge LE1, RE1 toward the center 0, and the mechanical strength takes a maximum value only at the center 0.

In the present invention, it is preferable that the mechanical strength from a position 5 mm inside the outer peripheral edge of composite member to the outer peripheral edge of the separation area be locally lower than the mechanical strength in the central portion. Referring to FIG. 3A, the separation area is preferably formed as a thin layer in such a manner that the position 5 mm inside the outer peripheral edge of the composite member is between LE1 and LE2 and/or between RE2 and RE1.

Furthermore, when a large-diameter composite member is separated from its outer peripheral edge toward the center, there is a case where the central portion of the composite member cannot be separated as desired. In this case, a mechanically weak portion may locally be formed in the central portion. FIG. 3B shows an example of such mode, in which a portion between periphery and center, i.e., a donut-shaped portion M is high in mechanical strength.

When a porous layer is used as the separation area, the porosity of the mechanically weak peripheral portion is set to 20% or more, preferably 35% or more, and the upper limit of the porosity may be 80% or less.

The porosity of the mechanically strong central portion is not limited as long as it is lower than that of the peripheral portion, but may be selected preferably from the range of 5% to 35%, more preferably from the range of 5% to 20% in such a manner that the porosity becomes lower than that of the peripheral portion. When a difference in porosity is 5% or more, preferably 10% or more, a difference of mechanical strength sufficient for easily separating the composite member can be obtained in the peripheral portion and the central portion.

Additionally, in FIG. 3B, the portions M are mechanically strong. Therefore, when the separation area is formed of the porous material, the porosity of the portion M, i.e., the portion having the maximum value of mechanical strength may be set low in the range of 5% to 35%, preferably 5% to 20%, in the same manner as the porosity of the central portion of FIG. 3A.

The porosity of the center 0 in FIG. 3B needs to be higher than that of the portion M, and may appropriately be selected from the range of 20% to 80% to satisfy such relationship.

Here, the porosity P (%) of the porous material indicates a proportion of pore volume in an apparent volume of the porous material. The porosity is represented in the following equation using a density m of the porous material formed on the first base substrate and a density M of a non-porous material:

$$P=\{(M-m)\div M\}\times 100 \ (\%) \tag{1}$$

Here, the density m of the porous material is obtained by dividing an apparent weight G of the porous material including pores by an apparent volume V of the porous material including the pores, and represented as follows:

$$m=G\div V \tag{2}$$

In practice, the porosity P of the porous layer of the base substrate in which only a depth d on the side of a surface has a porous layer structure can be obtained from the following equation using a weight A of the base substrate before the porous layer is formed thereon, a weight a of the base substrate after the porous layer is formed thereon, and a weight B of the base substrate after the porous layer is completely removed therefrom:

$$P=\{(A-a)\div(A-B)\}\times 100 \tag{3}$$

A method of preparing the composite member will next be described.

First, the first base substrate 1 of an Si wafer or the like is prepared, and the separation area 3 is formed on the surface of the first base substrate 1 or at a predetermined depth from the surface. Examples of the method for forming the separation area include a method of making the surface of the first base substrate 1 porous by anodization or the like and/or a method of implanting hydrogen ions, rare gas ions, or the like different from constituting elements of the base substrate to form an ion-implanted layer with a maximum ion implantation concentration at the predetermined depth from the surface of the first base substrate 1. The mechanically weak portion is formed in the peripheral portion by controlling the conditions of the anodization or ion implanting with procedures described later.

Subsequently, the non-porous layer 4 is formed on the separation area 3 if necessary, and the second base substrate is bonded. In the case of implanting the ions, a surface layer of the first base substrate constitutes the non-porous layer 4 as it is. When the surface of the first base substrate 1 is made porous, the layer 4 is formed thereon by sputtering or CVD. Subsequently, the non-porous layer 4 is bonded on the second base substrate of Si wafer or the like directly or via the insulating layer 6 as required. The composite member is thus completed.

In a method for forming the porous layer locally low in mechanical strength, the current density of anodization is changed in the plane. When the density of anodization current flowing into the peripheral portion of the semiconductor substrate is set high in the peripheral portion of the base, the thickness and/or porosity in the peripheral portion of the base substrate of the porous layer can be made higher than in the central portion of the base. To realize the current density distribution, for example, during the anodization, a sectional area, in which ion current flows, in an anodization liquid in the vicinity of the base substrate subjected to the formation is set larger than an area of the base substrate subjected to the formation. Thereby, a surface density of anodization current flowing into the base substrate peripheral portion may be set higher than a surface density of anodization current flowing into the base substrate center. Specifically, an anodization bath larger than the base substrate subjected to the formation is used, so that the ion current having a sectional area broader than the area of the base substrate is received by the base.

Figure 4:
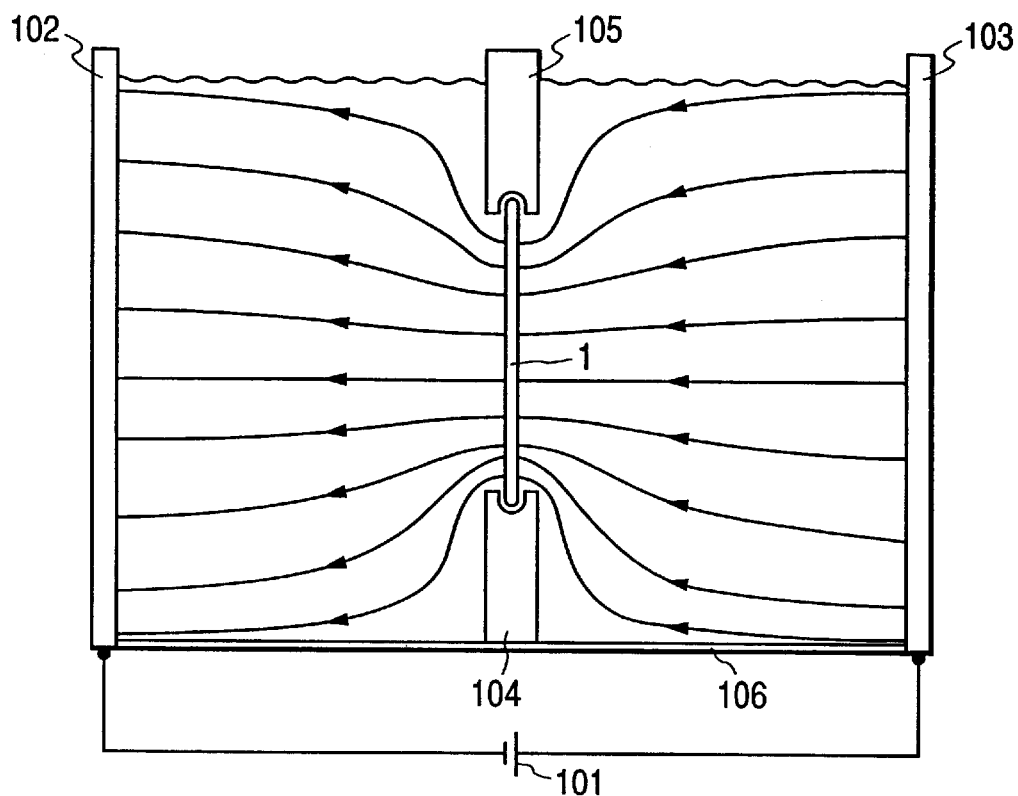
FIG. 4 is view showing a state in which an anodization for use in the present invention is applied.

FIG. 4 is a schematic view showing a device for use in anodization. In FIG. 4, numeral 101 denotes a DC power supply for the anodization, 102 denotes a cathode electrode, 103 denotes an anode electrode, and 104, 105 denote insulating supports for supporting the treated base substrate 1. The base substrate 1 is engaged in recesses of the supports 104, 105. Numeral 106 denotes an insulating bath bottom. The area of the electrode 102, 103 is about 1.2 to 3.0 times, preferably 1.3 to 2.0 times the area of the first base substrate 1. In the structure, when ions flowing from the outside via the outer peripheral edge of the base substrate are collected in the base, more ions flow into the peripheral portion of the base, and the thickness and porosity of the porous layer of the peripheral portion can be raised.

Furthermore, while a plurality of stages of anodization are performed, the peripheral portion of the first porous layer is formed thicker than the central portion. Therefore, the porosity of the peripheral portion of the second porous layer formed later can be made higher than the porosity of the central portion.

When such distribution of flowing currents needs to be controlled more precisely, a current guide is provided in the vicinity of the base substrate subjected to the formation for controlling the distribution of ion currents flowing into the base substrate surface. When the ion current distribution is controlled, a distribution of thickness of the layer with a small porosity can be controlled.

When the layer formed by the ion implanting in which microcavities can be obtained is used as the separation area, the size or density of microcavities or the thickness of distributed microcavities can be increased by raising an ion implanting density, so that the mechanical strength of the area can be reduced.

Therefore, when the ion implantation amount of the base substrate peripheral portion is set larger than that of the base substrate central portion, the density of microcavities per unit volume of the base substrate peripheral portion is raised, and the porosity can be made higher than that of the base substrate central portion.

Figure 5:
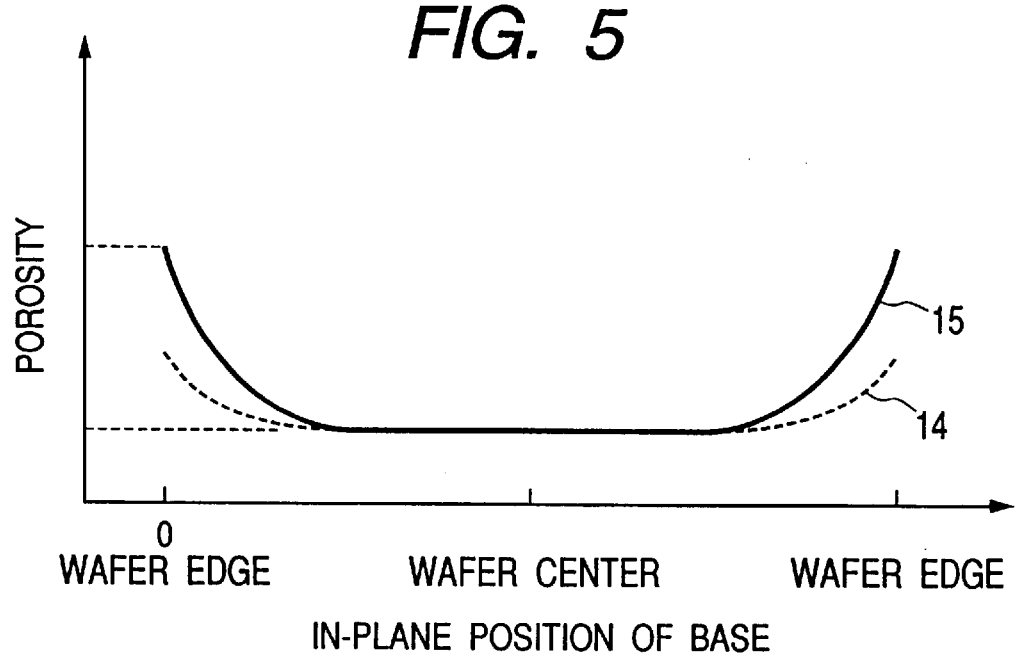
FIG. 5 is a characteristic diagram of porosity of a semiconductor substrate according to the present invention.

FIG. 5 is a graph showing an in-plane distribution of porosity in a diametric direction of the porous material obtained in the method shown in FIG. 4.

As the porosity increases, the mechanical strength decreases. Therefore, FIG. 5 shows a pattern vertically reverse to the pattern shown by the solid line 10 of FIG. 3A. When the ratio of the area of the electrode 102, 103 to the area of the base substrate is sufficiently large, a pattern shown by a solid line 15 is provided. When the ratio of the area of the electrode to the area of the base substrate is small, a tendency shown by a broken line 14 is provided. The porous material with a high porosity can thus be formed in the peripheral portion.

A technique for preparing a porous layer with a mechanical strength distribution shown in FIG. 1A or by the dashed line 11 of FIG. 3A will next be described. A first method is as follows:

A mask for ion implantation or photoresist pattern is provided only on the outer peripheral portion of the base substrate 1, while boron ions are injected to the central portion. The base substrate having a low boron ion concentration locally in the outer periphery is subjected to anodization using an electrode having substantially the same area as that of the base, and the porous layer is prepared in which the outer peripheral portion has a high porosity while the central portion has a low porosity.

A second method is as follows:

The central portion of the base substrate excluding its outer peripheral portion is covered with wax or another mask resistant to the anodization, and general anodization is performed under a high current density to make porous the outer peripheral portion. Subsequently, the outer peripheral portion is masked, and the general anodization is performed under a low current density to make porous the central portion.

In a third method, after a uniform porous layer is formed by the general anodization, only the porosity of the outer peripheral portion is raised by ion implanting. When the distribution of ion implantation amount is controlled, the porous layer having the strength distribution as shown in FIGS. 3A, 3B can be formed with good controllability.

Additionally, in respect of the manufacture cost, the method shown in FIG. 4 is more advantageous than these methods.

A method of preparing the composite member shown in FIG. 1C will next be described in more detail.

An Si wafer or another base substrate is oxidized to form the insulating film 6. Hydrogen or rare gas ions are implanted into the entire surface of the base substrate with a predetermined acceleration voltage. The central portion excluding the outer peripheral portion is covered with a photoresist mask pattern, and the ions are again implanted into the outer peripheral portion with the same acceleration voltage. The separation area 3 having the mechanically weak portion 32 can be formed in this manner. After the mask pattern is removed, the insulating layer 6 is bonded onto the second base substrate 2. Each of doses in first and second ion implanting operations is set in the range of $10^{15}$ cm$^{-2}$ to $10^{17}$ cm$^{-2}$, while a concentration of different atoms in the mechanically weak portion may be set in the range of $10^{20}$ cm$^{-3}$ to $10^{23}$ cm$^{-3}$.

Figure 6A:
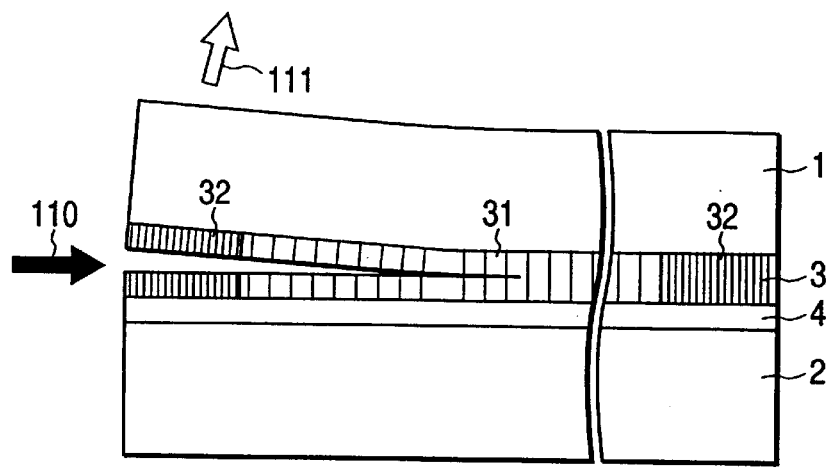
FIGS. 6A, 6B and 6C are views showing a separation method of the composite member according to the present invention.
Figure 6B:
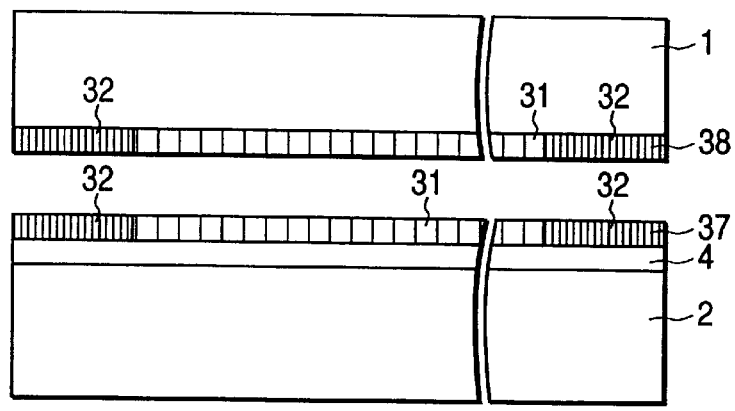
Figure 6C:
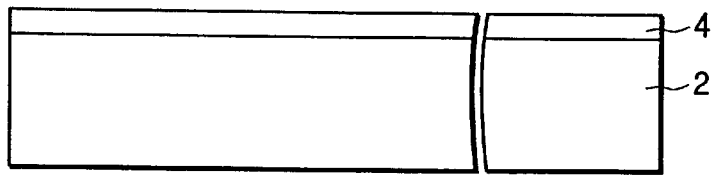

A method of separating the composite member for use in the present invention will next be described. A mode of separating the composite member shown in FIG. 1A will be described as an example. As shown in FIG. 6A, an inner stress generated by thermal treatment or the like or an external force is used to separate the composite member. In the separation area 3, since the peripheral portion 32 locally has a low mechanical strength, it is first collapsed or cracked. FIG. 6A shows that a wedge 110 is inserted and a force 111 is applied to separate the peripheral portion of the first base substrate 1 from the second base substrate 2. Subsequently, as shown in FIG. 6B, the composite member is divided into two. When a residual layer 37 of the separation area 3 remaining on the non-porous layer 4 is relatively thick, the residual layer is removed by polishing or etching. Subsequently, thermal treatment (hydrogen annealing) is performed in an atmosphere of hydrogen if necessary. As shown in FIG. 6C, the base substrate 2 provided with the layer 4 having a smooth surface is obtained. For use in a solar battery, the residual layer does not need to be removed.

Examples of the separation method of the composite member usable in the present invention include pressurizing, pulling, shearing, wedge insertion, thermal treatment, vibration application, wire cutting, and various methods as disclosed in Japanese Patent Application Laid-open No. 7-302889. Additionally, as proposed in Japanese Patent Application No. 9-75498, the bonded first and second base substrates may be separated into a plurality of members in a separation area other than a bonded interface by spraying fluid or ejecting a jet of fluid to the vicinity of a side face of the separation area.

The jet of fluid for use in separation in the present invention can be realized by spouting pressurized fluid via a thin nozzle. A fluid jet method, as introduced in "Water Jet" Vol. 1, No. 1, page 4, can be used as a method for spouting a high-speed high-pressure flow of beams. In the fluid jet usable in the present invention, a liquid with a high pressure in the range of 100 to 3000 kgf/cm$^2$ pressurized by a high-pressure pump is spouted via a fine nozzle with a diameter of about 0.1 to 0.5 mm, so that ceramic, metal, concrete, resin, rubber, wood or another material can be cut (abrasive is added to water for a hard material), or worked. Additionally, a coating film of a surface layer can be removed, or member surfaces can be cleaned. In the conventional water jet method, it is a main effect to remove a part of the material as described above. Specifically, in the water jet cutting operation, a cutting width of a main member is removed, coating films are removed, or member surfaces are cleaned by removing unnecessary portions.

When water jet is used to form the fluid flow according to the present invention, the composite member can be separated by spouting the water jet to the side face of the separation area. In this case, the side face of the separation area is first exposed to the side face of the bonded base, and the water jet is directly spouted to the exposed portion or its peripheral portion. Then, the base substrate is separated into two without being damaged, while only the mechanically fragile separation area is removed by the water jet. Moreover, even if the side face of the separation area is not exposed beforehand for some reason, and the corresponding portion is covered with a thin layer like an oxide film, the layer covering the separation area is first removed with the water jet, before the base substrate can be separated with the water jet.

Moreover, an unused effect of the conventional water jet is used. Specifically, jet is spouted to a recess in the side face of the composite member to extend and collapse the structurally fragile separation area, so that the bonded wafer can be separated. In this case, chips of the separation area are hardly generated. Even if the separation area is formed of a material which cannot be removed by the jet, separation can be performed without using the abrasive or without damaging a separating surface.

The aforementioned effect is not an effect of cutting or polishing, and it can be expected to be an effect of wedge by the fluid as shown in FIG. 6A. This effect is much expected when a force is applied in a direction in which the separation area is pulled off by spouting the jet to a recess formed in the side face of the bonded base. In order to sufficiently fulfill the effect, the shape of the side face of the composite member is preferably concave, instead of being convex.

Figure 7:
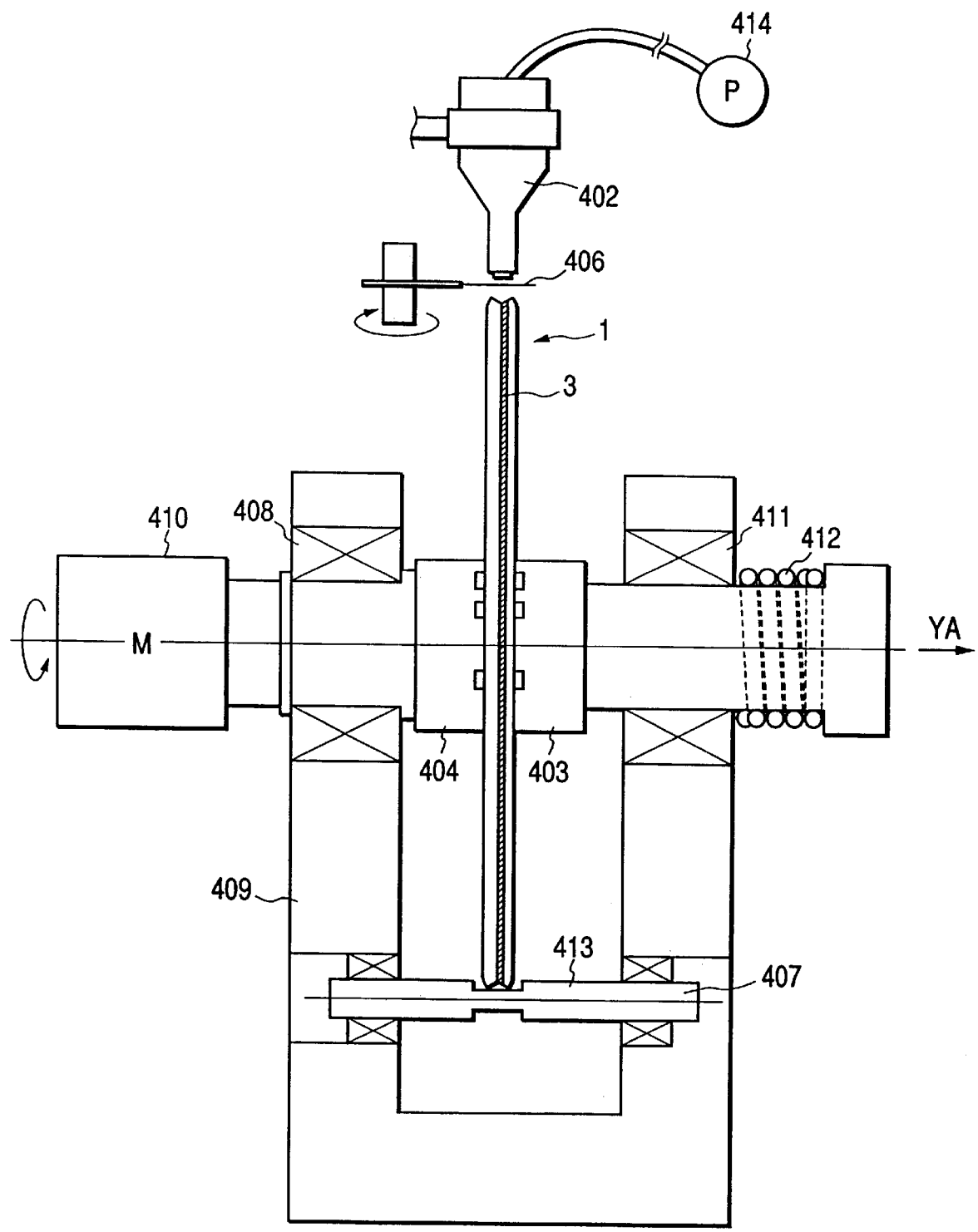
FIG. 7 is a schematic view of a water jet device.

FIG. 7 is a schematic perspective view showing an example of a water jet device for use in the method of manufacturing the semiconductor substrate in the present invention. In FIG. 7, a composite member 1 is formed by integrally bonding two Si wafers, and the separation area 3 is provided inside. Supports 403, 404 are provided on the same rotating shaft for adsorbing/fixing the composite member 1 by a vacuum chuck. Furthermore, the support 404 is connected to a support base substrate 409 via a bearing 408, and its rear is directly connected to a speed control motor 410, so that the support 404 can be rotated at an arbitrary speed. Moreover, the support 403 is connected to the support base substrate 409 via a bearing 411, and its rear is connected to the support base substrate 409 via a compression spring 412, so that a force is applied in a direction in which the support 403 is detached from the composite member 1.

First, the composite member 1 is set in accordance with a positioning pin 413, and adsorbed/held by the support 404. Since the composite member 1 is positioned by the positioning pin 413 of a tool 407, the central portion of the composite member 1 can be held. Subsequently, the support 403 is advanced toward the left along the bearing 411 until the composite member 1 is adsorbed/held. Then, a force exerted toward the right is applied to the support 403 by the compression spring 412. In this case, a returning force of the compression spring 412 and a force of the support 403 for sucking the composite member 1 are balanced to prevent the support 403 from being detached from the composite member 1 by the force of the compression spring 412.

Subsequently, water is fed to a water jet nozzle 402 from a water jet pump 414, and water is continuously spouted for a constant time until spouted water is stabilized. When the water is stabilized, a shutter 406 is opened to spout the water (hereinafter referred to as the jet water) to the side face of the composite member 1 from the water jet nozzle 402. In this case, the composite member 1 and the support 403 are rotated by rotating the support 404. Since the jet water is applied near the center of the thickness of the side face of the composite member 1, the composite member 1 is pushed/extended into two toward its center from its outer peripheral portion, the separation area relatively weak in the composite member 1 is collapsed, and the composite member is finally separated into two pieces.

As described above, the jet water is applied uniformly to the composite member 1. Moreover, while the support 403 supports the composite member 1, the force is exerted toward the right. Therefore, the separated pieces of the composite member 1 do not slide on each other.

Alcohol or another organic solvent; hydrofluoric acid, nitric acid or another acid; potassium hydroxide or another alkali; or another liquid having a function of selectively etching the separation area can be used as the fluid instead of water. Furthermore, usable as the fluid is air, nitrogen gas, carbonic acid gas, rare gas or another gas. Gas or plasma having a function of etching the separation area can also be used. In the separation method of the composite member introduced in the preparation method of the semiconductor substrate, pure water from which impurity metals or particles are removed as much as possible, super pure water or another water with high purity is preferably used. Moreover, a completely low-temperature process is introduced. Therefore, even if the jet fluid other than pure water is used, the impurities or particles can be removed by cleaning after the separation.

In the method of spraying the fluid as described above, the vicinity of the separation area of the composite member is preferably recessed in a concave shape for receiving the fluid to produce a force in a direction in which the separation area is pushed/extended. When the composite member formed by bonding two base substrates via the separation area is separated at the separation area, the aforementioned structure can easily be realized by chamfering edges of the bases.

The water jet or another fluid flow, pressurizing, pulling, shearing, wedge insertion, thermal treatment, vibration application, wire cutting, and other various methods may be used to apply a separating force to the separation area formed beforehand in the composite member and to separate the composite member into two. In this case, the separation is performed by collapsing the mechanically fragile portion of the separation area. When the fluid is spouted to the vicinity of the separation area, the mechanically fragile separation area is removed or collapsed by the fluid flow. When the fluid is used, however, basically the separation area is removed while the other non-fragile portions remain without being collapsed. As a result, the separation can advantageously be performed without damaging any portion that is used after the separation. In any of the methods, however, unless the separation area is sufficiently weak, it cannot be collapsed. For example, there is a case where the separation area cannot be collapsed or removed with the fluid flow with a predetermined pressure.

To solve the problem, when the pressure of the fluid is raised, not only the separation area but also the other portions are collapsed. For example, when the bonded base substrate is separated, the plate-like first or second base substrate is cracked. To prevent this, when the pressure of the fluid is lowered, however, the separation cannot be performed.

In most of the separation methods, in the initial separation stage, a solid wedge needs to be pushed into the vicinity of the surface of the separation area formed in the composite member, e.g., the separation area of the portion formed in the peripheral portion of the disc-shaped bonded base. In many cases, the separation needs to proceed from the surface. While the separation fails to proceed, the portion close to the surface has a small area to which the separating force is applied. A problem is therefore caused that a surface density of force has to be raised. This is because the separating force can be applied to the separated surface, but no separating force can be applied to the surface not yet separated. When the separation proceeds, the area to which the separating force can be applied is enlarged. Therefore, even when the separating force applied to the separating surface is increased to facilitate the separation, the surface density is decreased, and the base substrate can easily be prevented from being broken (cracked or otherwise) by the separation.

In order to facilitate the separation, in the initial stage of separation, the mechanical strength may be lowered by raising the porosity of the porous layer of the separation area, increasing the thickness of the porous layer, or increasing the ion implanting amount to increase the amount of generated microcavities. When the strength is excessively lowered, however, a disadvantage is caused that in the process of forming the composite member, the separation area is collapsed before the separation process.

As a result of intensive researches, the present inventors have found that in order to avoid the aforementioned disadvantages, the mechanical strength of the separation area is changed in parallel with the bonded face, and the mechanical strength particularly of the portion of the separation area close to the bonded base substrate surface, e.g., the peripheral portion is set lower than that of the base substrate central portion.

In the initial stage of separation, since the area of the separated face is small and the separating force cannot be increased, the mechanical strength of the separation area is reduced, so that the separation is advanced with a small force. This is realized by reducing the mechanical strength of the separation area in the vicinity of the base substrate peripheral portion. Peeling during the process is prevented by setting the mechanical strength of the separation area higher in the base substrate central portion than in the peripheral portion.

In this case, when the separation is advanced to the central portion, the separated area is broad. Therefore, even when the surface density of the separating force is reduced, the entire separating force is increased, and the separation can be advanced. Such effect is fulfilled regardless of the separation method, but the method of spouting the fluid flow to the separation area is most preferable for applying the separating force relatively uniformly to the entire separated face to prevent the base substrate from being broken.

Figure 8:
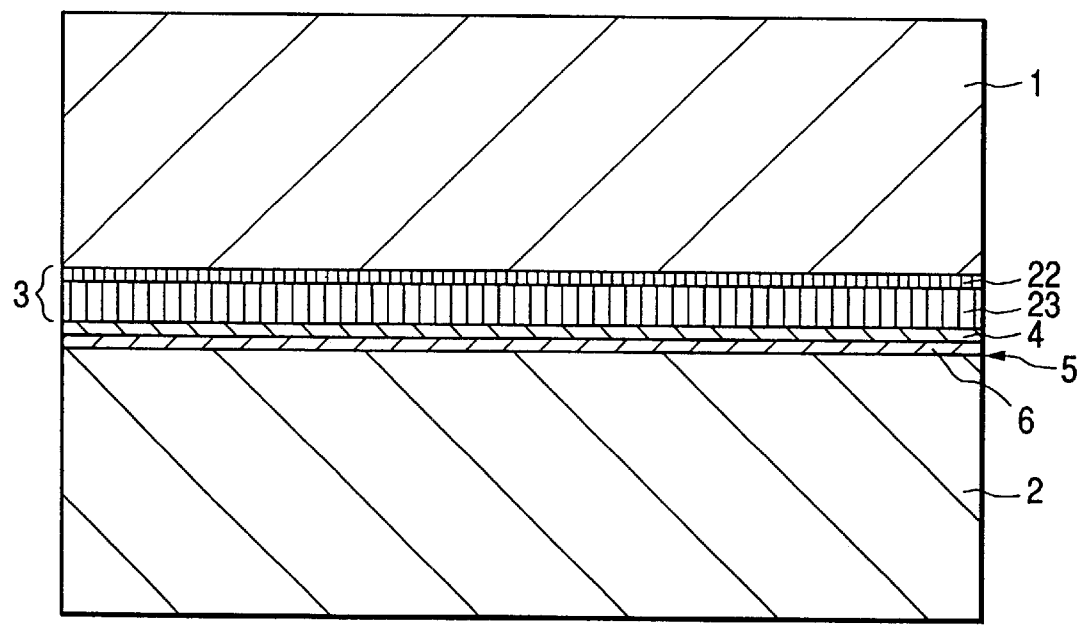
FIG. 8 is a sectional view of the composite member of the present invention.

In order to broaden the range of conditions for performing a stable separation to securely separate the base substrate without damaging it, as shown in FIG. 8, the separation area 3 is preferably formed of a plurality of layers or areas 22, 23 different in mechanical strength. In this case, the mechanical strength of the peripheral portion can relatively easily be made smaller as compared with that of the central portion of the base. When the separation area has a lamination structure of the layer 23 small in porosity (hereinafter referred to as the first porous layer) and the layer 22 large in porosity (hereinafter referred to as the second porous layer), the layer 23 small in porosity is first formed by the anodization, and subsequently the anodization current is increased to similarly form the layer 22 large in porosity by the anodization.

Figure 9:
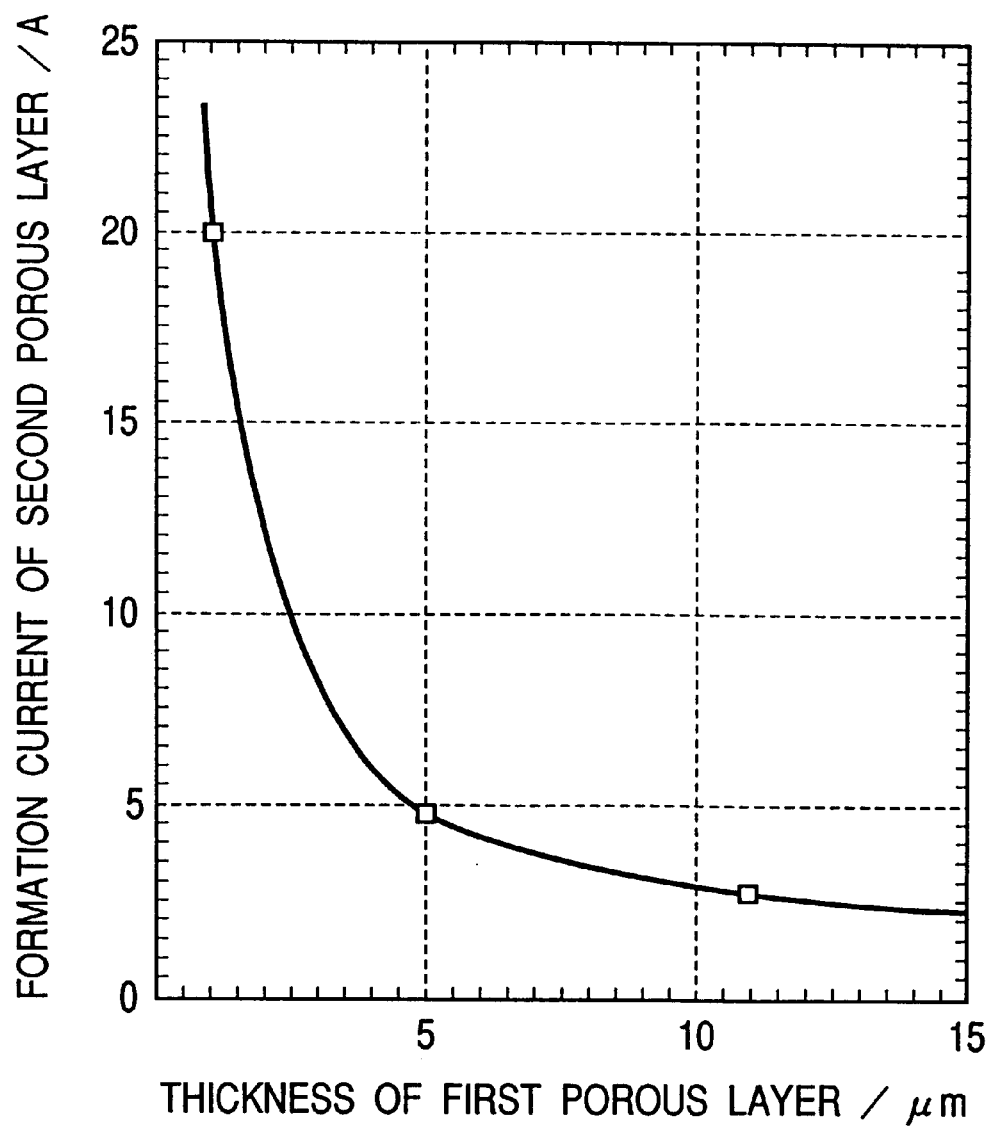
FIG. 9 is a characteristic diagram showing a porous thickness and an anodization current.

As a result of intensive researches, the present researchers have found that the porosity of the second porous layer 22 is not determined only by the magnitude of the current, and it also depends on the thickness or porosity of the first porous layer 23. When the anodization current of the second porous layer 22 is set equal, but the first porous layer 23 is thick or low in porosity, then the porosity of the second porous layer 22 tends to be increased. Therefore, for example, as the thickness of the first porous layer 23 is reduced, the anodization current of the second porous layer 22 needs to be raised in order to keep high the porosity of the second porous layer 22. This relationship is shown in FIG. 9.

Figure 10:
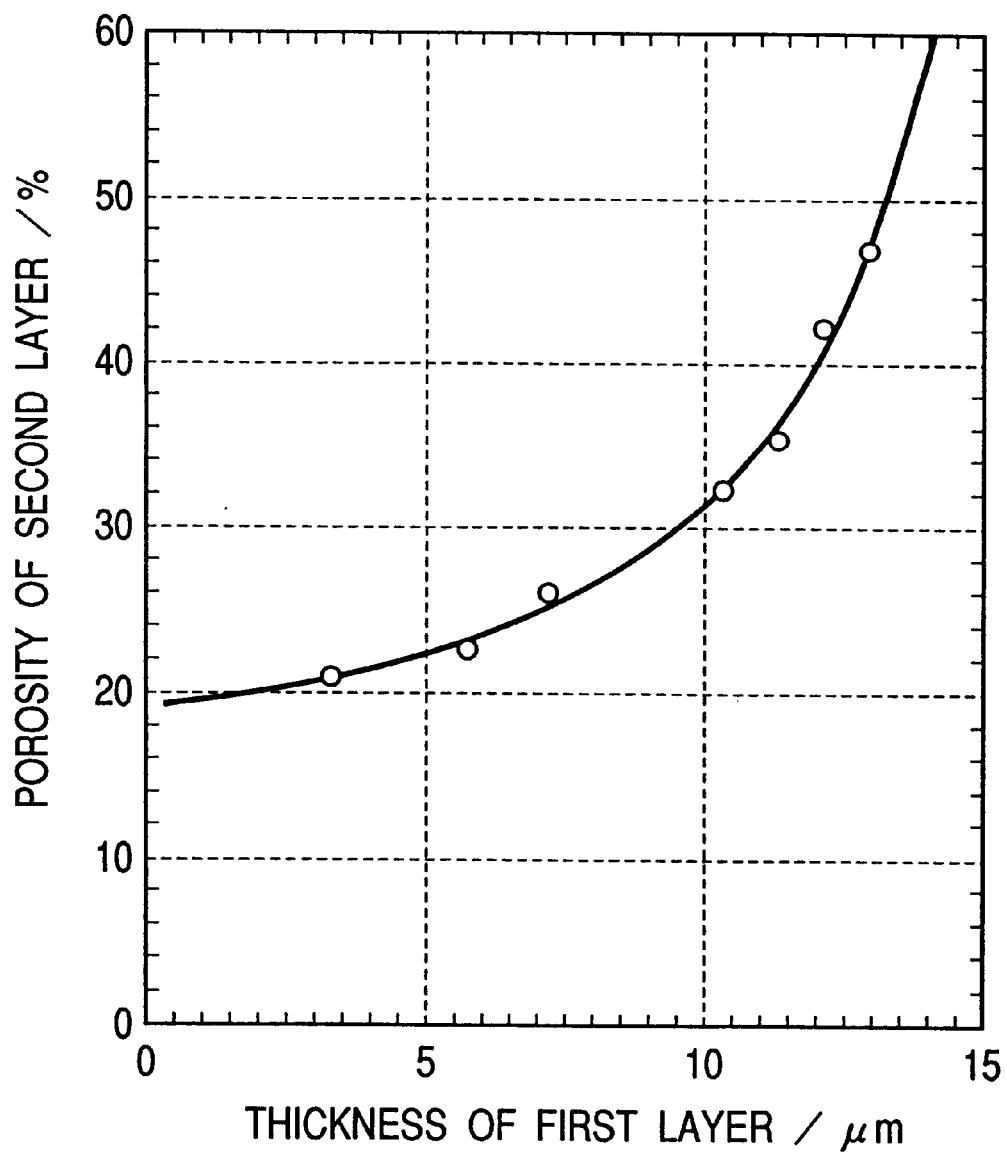
FIG. 10 is a characteristic diagram of porosity of a second layer relative to thickness of a first layer.

If the anodization current of the second porous layer is kept constant, and the thickness of the first porous layer is changed, the porosity of the second porous layer is influenced. Such relationship is shown in FIG. 10. It is apparent that after the first porous layer is formed, the second porous layer cannot be formed independently, and the characteristics of the first porous layer exert an influence on the porosity of the second porous layer. A detailed mechanism of such phenomenon is not completely explicated. As described later, however, $F^-$ ions in a formation liquid are necessary for forming porous Si. When the $F^-$ ions are consumed in a pore forming portion at a tip end of a pore, new $F^-$ ions need to be supplied to the tip end of the pore from a surface of the porous Si through the pore.

It is supposed that such effective transportability of the $F^-$ ions in the pore by electric field or diffusion depends on the pore size or length of the first layer, i.e., the thickness of the first layer. Specifically, the first porous layer itself formed by the anodization limits the transport of ions necessary for forming the subsequent porous layer.

Therefore, the formed first porous layer serves as a layer for limiting the effective transportability of the $F^-$ ions necessary for forming the subsequent porous layer. When the anodization current is constant, the formation is advanced to form a sufficient thickness without largely changing the porosity. This is because a pore of a size determined by a balance between consumption and supply of $F^-$ ions is formed at a constant current, but if the current is increased halfway, the balance between consumption and supply of the $F^-$ ions is changed by the existence of the formed porous layer, and the pore size is largely changed.

When the thickness of the first layer is increased and the effective transportability of $F^-$ ions transported through the layer is lowered, the concentration of $F^-$ ions in the tip end of the pore is decreased, and an ion lacking layer is spread in the formation liquid in the pore. Therefore, a portion in which a potential barrier of an interface between formation liquid and Si single-crystal surface in the pore is lowered is extended. In the portion Si is etched, and the pore size may be increased.

In practice, even when the anodization current is simply increased, the porosity is not much increased unless the transportability limiting layer is formed on the Si surface. This rather increases the formation rate. Therefore, in order to largely change the porosity by increasing the anodization current, the layer for limiting the transportability of the $F^-$ ions is necessary between porosity increasing layer and formation liquid. If the thickness of the first porous layer can be increased in the periphery of the base, the porosity of the second porous layer in the corresponding portion can be larger than the porosity of the second layer in a central portion where the first layer is thin. Thereby, the mechanical strength of the separation area of the base substrate peripheral portion can be reduced.

The present invention is characterized in that when the mechanism of the anodization is well used as described above to form the separation area comprising a plurality of layers or areas different in the mechanical strength, the porosity of the layer 22 large in porosity can be made higher in the peripheral portion than in the central portion of the base substrate by increasing the thickness of the layer 23 small in porosity in the peripheral portion rather than in the central portion of the base.

As described above, the porous layer can be formed on the wafer by the anodization using the simple device shown in FIG. 4. The layer with a small porosity can be formed thicker in the base substrate peripheral portion than in the base substrate central portion, which can make higher the porosity of the subsequently formed layer with a large porosity in the base substrate peripheral portion than in the base substrate central portion. When the distribution of incoming current needs to be controlled more precisely, the current guide is provided in the vicinity of the base substrate subjected to the formation for controlling the distribution of ion currents flowing into the base substrate surface. When the ion current distribution is controlled, the distribution of thickness of the layer with a small porosity can be controlled.

Moreover, the water jet injection device for separating the wafer and the thin-film semiconductor from the composite member comprising the first and second base substrates has been described above with reference to FIG. 7.

An example of the bonded base substrate usable in the method of the present invention will be described in more detail with reference to FIG. 8. In the example, as shown in FIG. 8, the separation area 3 has a double layer structure comprising the first porous layer 23 with a low porosity and the second porous layer 22 with a higher porosity and a lower mechanical strength. In the present invention, for the second porous layer 22, its porosity or thickness may be set higher in the vicinity of the base substrate peripheral portion than in the central portion. During the separation, cracks are generated in the second porous layer 22 in a position different from the bonded interface or in the interface. The second porous layer 22 has a low mechanical strength. Therefore, when a force is applied in a direction in which a first base substrate 21 and a second base substrate 27 are separated from each other, only the second porous layer 22 is collapsed and the base substrates are separated. In this case, when a layer 4 of non-porous single-crystal Si is formed, the first porous layer 23 is necessary as a protective layer for suppressing the generation of crystal defects or for preventing the layer 4 from being collapsed in the separation process. When the porosity is not much increased, the separation can be performed without forming the second porous layer 22, but the second porous layer 22 is preferably formed to provide a good yield.

Embodiments of the present invention will next be described in more detail.

EXAMPLE 1

A first P-type (or N-type) (100) single-crystal Si substrate with a thickness of 625 µm, a specific resistance of 0.01 Ω·cm and a diameter of eight inches was used, and anodization was performed in HF solution. A formation bath was prepared in such a manner that a sectional area of a plane parallel with a formation electrode of an anodization layer and the Si single-crystal base substrate was about twice an area of the Si base, and the formation bath was used.

Anodization conditions are as follows:
anodization current: 2.6 A
anodization solution: $HF:H_2O:C_2H_5OH=1:1:1$
time: 11 minutes The thickness of a central portion of a porous layer of the base substrate subjected to the formation was about 12 µm and the porosity of the central portion was about 20%, while the thickness of the porous layer of a peripheral portion was about 19 µm at maximum and the porosity was 30%. The pore size of the peripheral portion of the base substrate prepared under these conditions can be measured by observation with an electronic microscope. It is apparent that the pore size is larger in a portion deep from a surface than in the central portion. However, for the central portion or the peripheral portion, no remarkable difference in pore size can be found in the vicinity of the surface of the porous layer. This is essential for the subsequent process, in which Si single crystal having less defects is epitaxially developed into a porous layer structure.

The substrate was cleaned with hydrofluoric acid at 400° C. in the atmosphere of oxygen, then oxidized for one hour. Inner walls of pores of the porous Si were covered with a thermally oxidized film through the oxidization. After thermal treatment was performed at 950° C. in the atmosphere of hydrogen, single-crystal Si epitaxially grew by 0.3 µm on the porous Si by CVD method under the following conditions:

source gas: $SiH_4$
carrier gas: $H_2$
temperature: 900° C.
pressure: $1 \times 10^{-2}$ Torr
growth rate: 3.3 nm/sec Furthermore, 100 nm of $SiO_2$ layer was formed on a surface of the epitaxial Si layer by the thermal oxidization.

After the surface of the $SiO_2$ layer and a surface of a separately prepared Si substrate were overlapped and contacted with each other, thermal treatment was performed at 1180° C. for five minutes to perform bonding. When the composite member was set in the device shown in FIG. 7, and water jet injection was performed with a water pressure of 1000 kgf/cm² and a diameter of 0.15 mm, the porous Si layer was collapsed, the wafer was effectively divided in two, and the porous Si was exposed to a separated face of two Si substrates. Subsequently, the porous Si layer was selectively etched with etching liquid of $HF/H_2O_2/C_2H_5OH$. The porous Si was selectively etched and completely removed. The etching rate of the non-porous Si single crystal to the etching liquid is remarkably low, and the etching amount in the non-porous layer can practically be ignored. Specifically, a single-crystal Si layer having a thickness of 0.2 µm could be formed on the oxidized Si film. The single-crystal Si layer underwent no change even by the selective etching of the porous Si. Resulting SOI substrate was thermally treated in the atmosphere of hydrogen.

As a result of the observation of a cross section by a transmission electronic microscope, it was confirmed that no crystal defect was introduced to the Si layer and that good crystallizability was kept. Even when no oxide film was formed on the surface of the epitaxial Si layer, similar results were obtained. The first Si single-crystal substrate was reused as a first Si single-crystal substrate for obtaining another SOI substrate, by removing residual porous Si therefrom.

EXAMPLE 2

A first P-type (or N-type) (100) single-crystal Si substrate with a thickness of 625 µm, a specific resistance of 0.01 Ω·cm and a diameter of eight inches was used, and anodization was performed in HF solution. A formation bath was prepared in such a manner that a sectional area of a plane parallel with a formation electrode of an anodization layer and the Si single-crystal base substrate was about twice an area of the Si base, and was used.

Anodization conditions are as follows:

anodization current: 2.6 A anodization solution:$HF:H_2O:C_2H_5OH=1:1:1$ time: 11 minutes The thickness of a central portion of a first porous layer of the base substrate subjected to the formation was about 12 microns, and the porosity of the central portion was about 20%. The thickness of the porous layer of a peripheral portion was about 19 $\mu$m at maximum and the porosity was 30%. Subsequent to the formation of the first layer, the formation of a second layer was performed under the following conditions:

anodization current: 8 A anodization solution:$HF:H_2O:C_2H_5OH=1:1:1$ time: two minutes When the formation of the second layer was performed under the above conditions after the first layer was formed, the thickness of the center of the second layer was about two microns, and the porosity was about 40%. In the peripheral portion of the base, however, the porosity was about 55% at maximum, and its thickness was less than two microns.

However, for the central portion or the peripheral portion, no remarkable difference in pore size can be found in the vicinity of the surface of the first porous layer. This is essential for the subsequent process, in which Si single crystal having less defects is epitaxially developed into a porous layer structure.

The substrate was oxidized at 400° C. in the atmosphere of oxygen for one hour. Inner walls of pores of the porous Si were covered with a thermally oxidized film through the oxidization. Subsequently, after cleaning was performed with HF solution and thermal treatment was performed in the atmosphere of hydrogen, single-crystal Si epitaxially grew by 0.3 $\mu$m on the porous Si by CVD method. The growing conditions were as follows:

source gas: $SiH_4$ carrier gas: $H_2$ temperature: 900° C.

pressure: $1 \times 10^{-2}$ Torr growth rate: 3.3 nm/sec

Furthermore, 100 nm of $SiO_2$ layer was formed on a surface of the epitaxial Si layer by the thermal oxidization.

After the surface of the $SiO_2$ layer and a surface of a separately prepared Si substrate were overlapped and contacted with each other, thermal treatment was performed at 1180° C. for five minutes to perform bonding. A cross section of resulting composite member is diagrammatically shown in FIG. 11. The porous layer was exposed to wafer edges, the porous Si was etched to some degree, and a plate as sharp as a razor blade was inserted to the corresponding portion. Then, the porous Si layer was ruptured, the wafer was divided into two, and the porous Si was exposed. Subsequently, the porous Si layer was selectively etched with etching liquid of $HF/H_2O_2/C_2H_5OH$. The porous Si was selectively etched and completely removed. The etching rate of the non-porous Si single crystal to the etching liquid is remarkably low, and the etching amount in the non-porous layer provides a practically ignorable decrease of thickness. Specifically, a single-crystal Si layer having a thickness of 0.2 $\mu$m could be formed on the oxide Si film. The single-crystal Si layer underwent no change even by the selective etching of the porous Si. Resulting SOI substrate was thermally treated in the atmosphere of hydrogen.

As a result of the observation of a cross section by a transmission electronic microscope, it was confirmed that no crystal defect was introduced to the Si layer and that good crystallizability was kept. Even when no oxidized film was formed on the surface of the epitaxial Si layer, similar results were obtained. The first Si single-crystal substrate was reused as a first Si single-crystal substrate by removing residual porous Si therefrom.

EXAMPLE 3

A first P-type (or N-type) (100) single-crystal Si substrate with a thickness of 625 $\mu$m, a specific resistance of 0.01 $\Omega$·cm and a diameter of eight inches was used, and anodization was performed in HF solution. A formation bath was prepared in such a manner that a sectional area of a plane parallel with a formation electrode of an anodization layer and the Si single-crystal base substrate was about twice an area of the Si base, and was used.

Anodization conditions are as follows:

anodization current: 2.6 A anodization solution:$HF:H_2O:C_2H_5OH=1:1:1$ time; 11 minutes The thickness of a central portion of a first porous layer of the base substrate subjected to the formation was about 12 microns, and the porosity of the central portion was about 20%. The thickness of the porous layer of a peripheral portion was about 19 $\mu$m at maximum and the porosity was 30%. Subsequent to the formation of the first layer, the formation of a second layer was performed under the following conditions:

anodization current: 8 A anodization solution:$HF:H_2O:C_2H_5OH=1:1:1$ time: two minutes When the formation of the second layer was performed under the above conditions after the first layer was formed, the thickness of the center of the second layer was about two microns, and the porosity was about 40%. In the peripheral portion of the base, however, the porosity was about 55% at maximum, and its thickness was less than two microns.

However, for the central portion or the peripheral portion, no remarkable difference in pore size can be found in the vicinity of the surface of the first porous layer. This is essential for the subsequent process, in which Si single crystal having less defects is epitaxially developed into a porous layer structure.

The substrate was oxidized at 400° C. in the atmosphere of oxygen for one hour. Inner walls of pores of the porous Si were covered with a thermally oxidized film through the oxidization. After cleaning was performed with HF solution and thermal treatment was performed in the atmosphere of hydrogen, single-crystal Si epitaxially grew by 0.3 $\mu$m on the porous Si by CVD method. The growing conditions were as follows:

source gas: $SiH_4$ carrier gas: $H_2$ temperature: 900° C.

pressure: $1 \times 10^{-2}$ Torr growth rate: 3.3 nm/sec

Furthermore, 100 nm of $SiO_2$ layer was formed on a surface of the epitaxial Si layer by the thermal oxidization.

Figure 11:
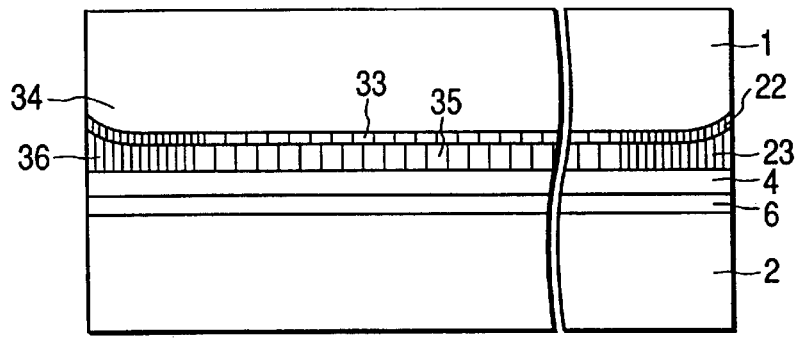
FIG. 11 is a sectional view of the composite member according to an embodiment of the present invention.
Figure 12A:
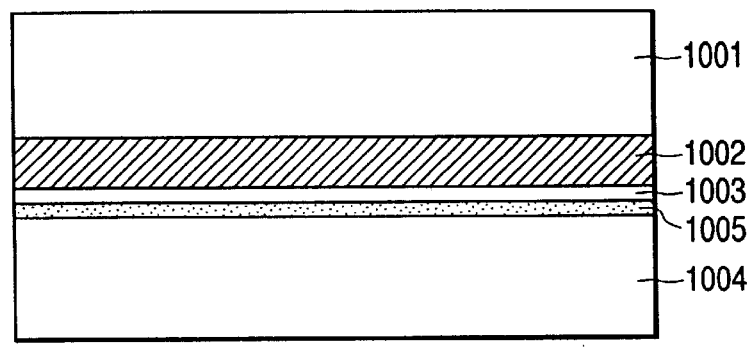
FIGS. 12A, 12B and 12C are views showing a conventional preparation method of a semiconductor substrate.
Figure 12B:
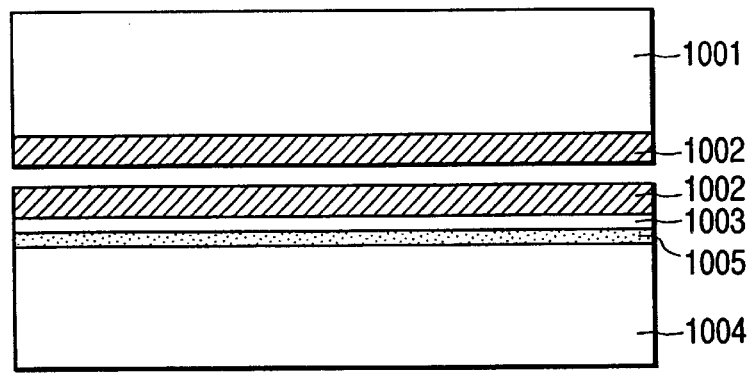
Figure 12C:
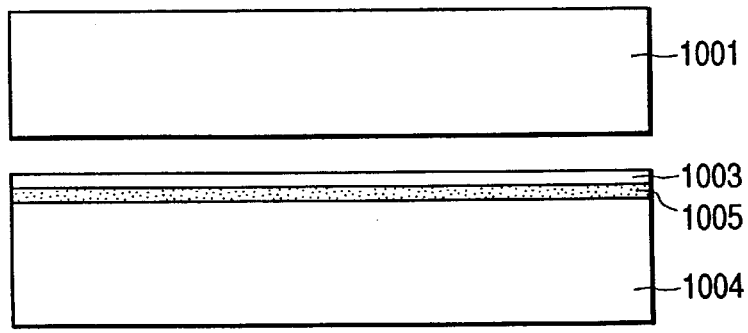

After the surface of the $SiO_2$ layer and a surface of a separately prepared Si substrate were overlapped and contacted with each other, thermal treatment was performed at 1180° C. for five minutes to perform bonding. The composite member as shown in FIG. 11 was thus obtained. For wafer side faces, water jet injection was performed with a water pressure of 300 kgf/cm² and a diameter of 0.1 mm. Then, the porous Si layer was ruptured, the wafer was effectively divided into two, and the porous Si was exposed. Subsequently, the porous Si layer was selectively etched with etching liquid of HF/H₂O₂/C₂H₅OH. The porous Si was selectively etched and completely removed. The etching rate of the non-porous Si single crystal to the etching liquid is remarkably low, and the etching amount in the nonporous layer provides a practically ignorable decrease of thickness. Specifically, a single-crystal Si layer having a thickness of 0.2 μm could be formed on the oxide Si film. The single-crystal Si layer underwent no change even by the selective etching of the porous Si. Resulting SOI substrate was thermally treated in the atmosphere of hydrogen.

As a result of the observation of a cross section by a transmission electronic microscope, it was confirmed that no crystal defect was introduced to the Si layer and that good crystallizability was kept. Even when no oxidized film was formed on the surface of the epitaxial Si layer, similar results were obtained. The first Si single-crystal substrate was reused as a first Si single-crystal substrate by removing residual porous Si therefrom.

EXAMPLE 4

A first P-type or N-type (100) single-crystal Si substrate with a thickness of 625 μm, a specific resistance of 0.01 Ω·cm and a diameter of eight inches was used, and anodization was performed in HF solution. A formation bath was prepared in such a manner that a sectional area of a plane parallel with a formation electrode of an anodization layer and the Si single-crystal base substrate was about 1.3 times an area of the Si base, and was used.

Anodization conditions are as follows:

anodization current: 2.6 A anodization solution:HF:H₂O:C₂H₅OH=1:1:1 time: 11 minutes

The thickness of a central portion of a first porous layer of the base substrate subjected to the formation was about six microns, and the porosity of the central portion was about 20%. The thickness of the porous layer of a peripheral portion was about eight μm at maximum and the porosity was 25%. Subsequent to the formation of the first layer, the formation of a second layer was performed under the following conditions:

anodization current: 12 A anodization solution:HF:H₂O:C₂H₅OH=1:1:1 time: one minute

For the central portion or the peripheral portion, no remarkable difference in pore size can be found in the vicinity of the surface of the first porous layer. This is essential for the subsequent process, in which Si single crystal having less defects is epitaxially developed into a porous layer structure.

The substrate was oxidized at 400° C. in the atmosphere of oxygen for one hour. Inner walls of pores of the porous Si were covered with a thermally oxidized film through the oxidization. After cleaning was performed with HF solution and thermal treatment was performed in the atmosphere of hydrogen, single-crystal Si epitaxially grew by 0.3 μm on the porous Si by CVD method. The growing conditions were as follows:

source gas: SiH₄ carrier gas: H₂ temperature: 900° C.

pressure: 1×10⁻² Torr growth rate: 3.3 nm/sec

Furthermore, 100 nm of SiO₂ layer was formed on a surface of the epitaxial Si layer by the thermal oxidization.

After the surface of the SiO₂ layer and a surface of a separately prepared Si substrate were overlapped and contacted with each other, thermal treatment was performed at 1180° C. for five minutes to perform bonding. The porous layer was exposed to wafer edges and, instead of etching the porous Si to some decree, water jet injection was performed with a water pressure of 300 kgf/cm² and a diameter of 0.1 mm. Then, the porous Si layer was ruptured, the wafer was effectively divided into two, and the porous Si was exposed. Subsequently, the porous Si layer was selectively etched with etching liquid of HF/H₂O₂/C₂H₅OH. The porous Si was selectively etched for a shorter time than in the third example, and completely removed. The etching rate of the non-porous Si single crystal to the etching liquid is remarkably low, and the etching amount in the non-porous layer provides a practically ignorable decrease of film thickness. Specifically, a single-crystal Si layer having a thickness of 0.2 μm could be formed on the oxidized Si film. The single-crystal Si layer underwent no change even by the selective etching of the porous Si. Resulting SOI substrate was thermally treated in the atmosphere of hydrogen.

As a result of the observation of a cross section by a transmission electronic microscope, it was confirmed that no crystal defect was introduced to the Si layer and that good crystallizability was kept. Even when no oxidized film was formed on the surface of the epitaxial Si layer, similar results were obtained. The first Si single-crystal substrate was used again as a first Si single-crystal substrate by removing residual porous Si therefrom.

EXAMPLE 5

A first P-type (or N-type) (100) single-crystal Si substrate with a thickness of 625 μm, a specific resistance of 0.01 Ω·cm and a diameter of eight inches was used, and anodization was performed in HF solution. A formation bath was prepared in such a manner that a sectional area of a plane parallel with a formation electrode of an anodization layer and the Si single-crystal base substrate was about 1.3 times an area of the Si base, and was used.

Anodization conditions are as follows:

anodization current: 2.6 A anodization solution:HF:H₂O:C₂H₅OH=1:1:1 time: 11 minutes

The thickness of a central portion of a first porous layer of the base substrate subjected to the formation was about six microns, and the porosity of the central portion was about 20%. The thickness of the porous layer of a peripheral portion was about eight μm at maximum and the porosity was 25%. Subsequent to the formation of the first layer, the formation of a second layer was performed under the following conditions:

anodization current: 12 A anodization solution:HF:H₂O:C₂H₅OH=1:1:1 time: one minute

For the central portion or the peripheral portion, no remarkable difference in pore size can be found in the vicinity of the surface of the first porous layer. This is essential for the subsequent process, in which Si single crystal having less defects is epitaxially developed into a porous layer structure.

The substrate was oxidized at 400° C. in the atmosphere of oxygen for one hour. Inner walls of pores of the porous Si were covered with a thermally oxidized film through the oxidization. After cleaning was performed with HF solution and thermal treatment was performed in the atmosphere of hydrogen, single-crystal Si epitaxially grew by 0.3 μm on the porous Si by CVD method. The growing conditions were as follows:

source gas: $SiH_4$
carrier gas: $H_2$
temperature: 900° C.
pressure: $1 \times 10^{-2}$ Torr
growth rate: 3.3 nm/sec Furthermore, 100 nm of $SiO_2$ layer was formed on a surface of the epitaxial Si layer by the thermal oxidization.

After the surface of the $SiO_2$ layer and a surface of a separately prepared Si substrate were overlapped and contacted with each other, thermal treatment was performed at 1180° C. for five minutes to perform bonding. The porous layer was exposed to wafer edges, and the porous Si was etched to some degree. A multiplicity of bonded base substrates prepared as described above were simultaneously submerged in a water bath of an ultrasonic radiation device. When about 50 kHz of ultrasonic waves were radiated, porous Si layers of all the bonded base substrates were ruptured, each wafer was divided into two, and the porous Si was exposed. Subsequently, the porous Si layer was selectively etched with etching liquid of $HF/H_2O_2/C_2H_5OH$. The porous Si was selectively etched in a shorter time than in the third example, and completely removed. The etching rate of the non-porous Si single crystal to the etching liquid is remarkably low, and the etching amount in the non-porous layer provides a practically ignorable decrease of thickness. Specifically, a single-crystal Si layer having a thickness of 0.2 μm could be formed on the oxidized Si film. The single-crystal Si layer underwent no change even by the selective etching of the porous Si.

As a result of the observation of a cross section by a transmission electronic microscope, it was confirmed that no crystal defect was introduced to the Si layer and that good crystallizability was kept. Even when no oxidized film was formed on the surface of the epitaxial Si layer, similar results were obtained. The first Si single-crystal substrate was used again as a first Si single-crystal substrate by removing residual porous Si therefrom.

EXAMPLE 6

As an insulating layer, 200 nm of oxidized film ($SiO_2$ layer) was formed on a surface of a first single-crystal Si substrate.

A first ion implantation was performed from the surface of the first substrate in such a manner that projection range fell in the Si substrate. In this manner, a layer serving as a separation area was formed as a distorted layer by a microcavity layer or a layer with a high concentration of ions injected therein in a depth of the projection range. Subsequently, under substantially the same conditions as those of the first ion implantation, ion implantation was again performed in the range of a 10 mm wide peripheral portion of the substrate. Thereby, the ion implantation amount of the peripheral portion was about twice that of the central portion.

After the ion implantation, a surface of the $SiO_2$ layer and a surface of a second Si substrate separately prepared were overlapped and contacted with each other, then thermal treatment was performed at 600° C. to perform bonding.

While the central portion of the substrate bonded as described above was held, and the substrate was rotated around a central axis, water jet injection was performed from the peripheral portion in parallel with a bonded face under a water pressure of 300 $kgf/cm^2$ and a diameter of 0.1 mm. Then, the separation area was collapsed and the wafer was remarkably effectively separated.

As a result, the $SiO_2$ layer, surface single-crystal layer and a part of separation layer originally formed on the surface of the first substrate were transferred to the second substrate. A remaining part of the separation layer was left on the surface of the first substrate. After the separation, the second substrate was annealed at 1000° C. Thereafter, the separation layer transferred to the second substrate was polished and removed with CMP device, and its surface was smoothed.

Specifically, a single-crystal Si layer having a thickness of 0.2 μm could be formed on the oxidized Si film. For all in-plane faces, the thickness of the single-crystal Si layer formed on the insulating layer as described above was measured in 100 points or positions. As a result, the uniformity of the film thickness was 201 nm±7 nm.

As a result of the observation of a cross section by a transmission electronic microscope, it was confirmed that no new crystal defect was introduced to the Si layer and that good crystallizability was kept.

Furthermore, after thermal treatment was performed at 1100° C. in hydrogen for one hour, surface roughness was evaluated with an interatomic force microscope. As a result, an average square roughness in 50 μm square was about 0.2 nm, which was equivalent to the roughness of an ordinarily marketing Si wafer.

Even when the oxidized film was formed on only the surface of the second substrate or on the surfaces of the epitaxial layer and second substrate, similar results were obtained.

Moreover, when the separation layer remaining on the first substrate is regenerated by etching or surface polishing, and hydrogen annealing or another surface treatment is further applied if necessary, the substrate can be used again as a first or second substrate.

In the example, the surface area of the Si wafer is transferred to the second substrate via the separation layer by the ion implantation, but an epitaxial wafer may be used to transfer the epitaxial layer to the second substrate via the separation layer by the ion implantation. Moreover, after the ion implantation of the example, a surface $SiO_2$ is removed, an epitaxial layer is formed, $SiO_2$ is further formed, then the bonding process is performed, so that the epitaxial layer may be transferred to the second substrate via the separation by the ion implantation. In the latter case, the surface area of the Si wafer is also transferred.

In the aforementioned examples for separating the composite member, even when the separating force is raised, the separation proceeds toward the inside from edges of the bonded base substrates without breaking one or both of the halfway separated bases. Moreover, the separated first base substrate may be used again as a semiconductor base substrate for obtaining the next SOI substrate.

Additionally, one of the separated base substrates can be reused in preparing bonded bases, which enhances a yield of base substrate separation.

Moreover, particles generated by the collapsed separation area can be prevented from causing contamination in the process. Furthermore, when the separation is performed by another method using no fluid, the separation yield can be enhanced.

Additionally, a suitable composite member can be prepared in such a manner that when the base substrate is separated from the separation area formed inside the bonded semiconductor base substrate or another composite member, separation does not occur before the separation process, and separation is securely performed in the separation process.

What is claimed is:

1. A composite member comprising a separation area inside, wherein mechanical strength of the separation area is non-uniform along a surface of the composite member and wherein portions different from each other in porosity, thickness or ion implantation amount are formed in the separation area such that a mechanical strength of a peripheral portion of the separation area is locally low.

2. A composite member formed by bonding a first base substrate and a second base substrate to each other which is comprised of a separation area formed in a position different from a bonded face and inside the composite member, a mechanical strength of the separation area being non-uniform along the bonded face, and a mechanical strength of a peripheral portion of the separation area being locally low.

* * * * *

UNITED STATES PATENT AND TRADEMARK OFFICE
CERTIFICATE OF CORRECTION

PATENT NO. : 6,597,039 B2  Page 1 of 1
APPLICATION NO. : 10/020807
DATED : July 22, 2003
INVENTOR(S) : Kazuaki Ohmi et al.

It is certified that error appears in the above-identified patent and that said Letters Patent is hereby corrected as shown below:

COLUMN 1
Line 8, "a application" should read --an application--.

COLUMN 18
Line 24, "time;" should read --time:--.

COLUMN 19
Line 11, "nonporous" should read --non-porous--.

COLUMN 20
Line 13, "decree," should read --degree,--.

COLUMN 22
Line 31, "marketing" should read --marketed--.

Signed and Sealed this

Twentieth Day of February, 2007

JON W. DUDAS
*Director of the United States Patent and Trademark Office*